US007043379B2

(12) United States Patent
Gauthier et al.

(10) Patent No.: US 7,043,379 B2
(45) Date of Patent: May 9, 2006

(54) METHOD FOR QUANTIFYING I/O CHIP/PACKAGE RESONANCE (75) Inventors: Claude R. Gauthier, Cupertino, CA (US); Aninda K. Roy, San Jose, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 646 days.

(21) Appl. No.: 10/277,302

(22) Filed: Oct. 22, 2002

(65) Prior Publication Data

US 2004/0088624 A1 May 6, 2004

(51) Int. Cl.
G06F 19/00 (2006.01)

(52) U.S. Cl. .................. 702/60; 324/520; 324/521; 702/65; 702/57

(58) Field of Classification Search .............. None
See application file for complete search history.

(56) References Cited

U.S. PATENT DOCUMENTS

| 4,451,916 | A |   | 5/1984 | Casper et al. |        |
|-----------|---|---|--------|---------------|--------|
| 4,542,380 | A |   | 9/1985 | Beckner et al. |       |
| 4,545,013 | A |   | 10/1985 | Lyon et al. |        |
| 4,562,573 | A |   | 12/1985 | Murano et al. |      |
| 4,731,588 | A | * | 3/1988 | Addis et al. ........ | 330/254 |
| 5,844,762 | A | * | 12/1998 | Yamamura et al. .... | 361/111 |
| 5,956,349 | A |   | 9/1999 | Watanabe et al. |     |
| 5,963,023 | A | * | 10/1999 | Herrell et al. ...... | 323/265 |
| 6,345,365 | B1 |  | 2/2002 | Takahashi et al. |    |
| 6,400,724 | B1 |  | 6/2002 | Yao |                  |
| 6,463,109 | B1 |  | 10/2002 | McCormack et al. |   |
| 6,700,390 | B1 | * | 3/2004 | Gauthier et al. ...... | 324/600 |
| 6,781,355 | B1 | * | 8/2004 | Gauthier et al. ...... | 323/233 |
| 6,822,345 | B1 | * | 11/2004 | Gauthier et al. ...... | 307/64 |
| 6,842,351 | B1 | * | 1/2005 | Gauthier et al. ...... | 363/39 |
| 6,909,203 | B1 | * | 6/2005 | Gauthier et al. ...... | 307/100 |
| 2003/0107452 | A1 | * | 6/2003 | Novak ............... | 333/32 |
| 2003/0197430 | A1 | * | 10/2003 | Gauthier et al. ...... | 307/102 |
| 2003/0222655 | A1 | * | 12/2003 | Gauthier et al. ...... | 324/601 |
| 2004/0049708 | A1 |  | 3/2004 | Thomas et al. |      |
| 2004/0076025 | A1 | * | 4/2004 | Gauthier et al. ...... | 363/50 |
| 2004/0123166 | A1 | * | 6/2004 | Gauthier et al. ...... | 713/300 |
| 2004/0124715 | A1 | * | 7/2004 | Huang et al. ......... | 307/127 |
| 2004/0165406 | A1 | * | 8/2004 | Gauthier et al. ...... | 363/39 |
| 2004/0169571 | A1 | * | 9/2004 | Chang et al. ......... | 333/219 |
| 2005/0110551 | A1 | * | 5/2005 | Bonaccio et al. ..... | 327/310 |

OTHER PUBLICATIONS

Bai et al., "Simultaneous Switching Noise and Resonance Analysis of On-Chip Power Distribution Network", IEEE, 2002.*

(Continued)

Primary Examiner—Patrick J. Assouad
(74) Attorney, Agent, or Firm—Osha-Liang LLP (57) ABSTRACT A method for quantifying effects of resonance in an integrated circuit's power distribution network is provided. The power distribution network includes a first power supply line and a second power supply line to provide power to the integrated circuit. Test ranges are selected for two test parameters, reference voltage potential of a receiver and data transmission frequency of the integrated circuit. At each combination of the two test parameters, bit patterns are transmitted by the integrated circuit to the receiver. A comparison is made between the transmitted bits and the received bits to determine whether the transmitted bits were correctly received. The comparison may be used to determine and report a range of values for the reference voltage potential and data transmission frequency that allow the transmitted bits to be correctly received.

25 Claims, 12 Drawing Sheets

OTHER PUBLICATIONS

Na et al., "The Effects of On-Chip and Package Decoupling Capacitors and an Efficient ASIC Decoupling Methodology", IEEE, 2004.*

Na et al., "Modeling and Simulation of Core Switching Noise for ASICs", IEEE, 2002.*

Garben et al., "Frequency Dependencies of Power Noise", IEEE, 2002.*

O'Sullivan et al., "Developing a Decoupling Methodology with SPICE for Multilayer Printed Circuit Boards", IEEE, 1998.*

Jong et al, "Modeling and Simulation of Switching Noise Including Power/Ground Plance Resonance for High Speed GaAs FET Logic (FL) Circuits", IEEE, 1995.*

* cited by examiner

METHOD FOR QUANTIFYING I/O CHIP/PACKAGE RESONANCE

BACKGROUND OF INVENTION

Figure 1:
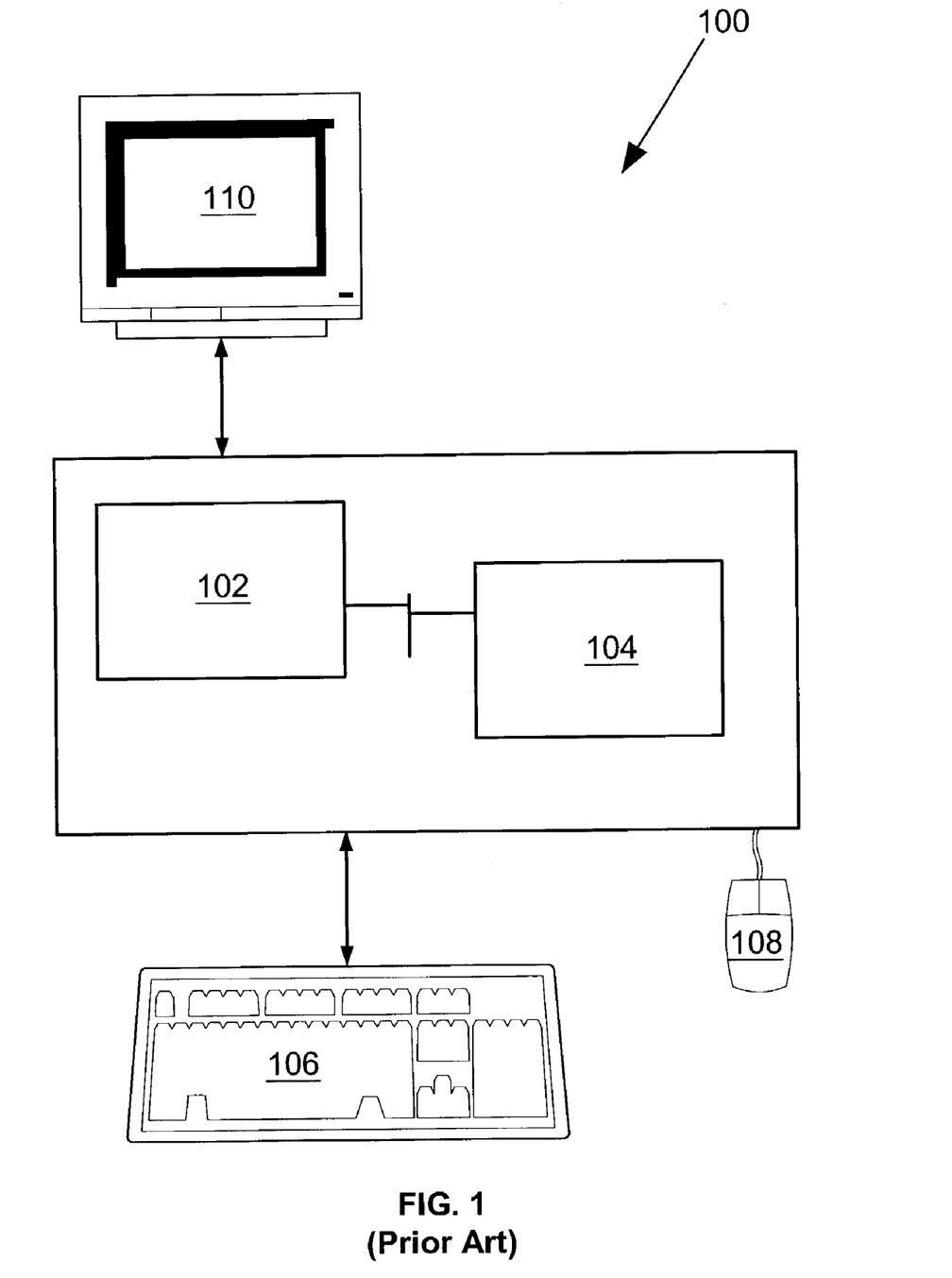
FIG. 1 shows a prior art computer system.

As shown in FIG. 1, a common computer (100) includes a central processing unit (CPU) (102), memory (104), and numerous other elements and functionalities typical of today's computers (not shown). The computer (100) may also include input means, such as a keyboard (106), a mouse (108), and an output device, such as a monitor (110). Those skilled in the art will understand that these input and output means may take other forms in an accessible environment. In one or more embodiments of the invention, the computer system may have multiple processors and may be configured to handle multiple tasks.

The CPU (102) is an integrated circuit (IC), and is one of many integrated circuits included in the computer (100). Integrated circuits may perform operations on data and transmit resulting data to other integrated circuits. The correct operation of the computer relies on error-free transmission of data between integrated circuits.

An IC operates between two power supply lines, one at a higher voltage potential and one at a lower voltage potential. In the present invention, the higher power supply line is designated $V_{DD}$. The lower power supply line may supply any voltage potential lower than the higher power supply line, but typically it will supply a zero voltage potential also referred to as ground. In the present invention, the lower power supply line is designated $V_{SS}$. A two line power supply that uses a single voltage potential and ground for the two lines is called a single-ended power supply.

Figure 2:
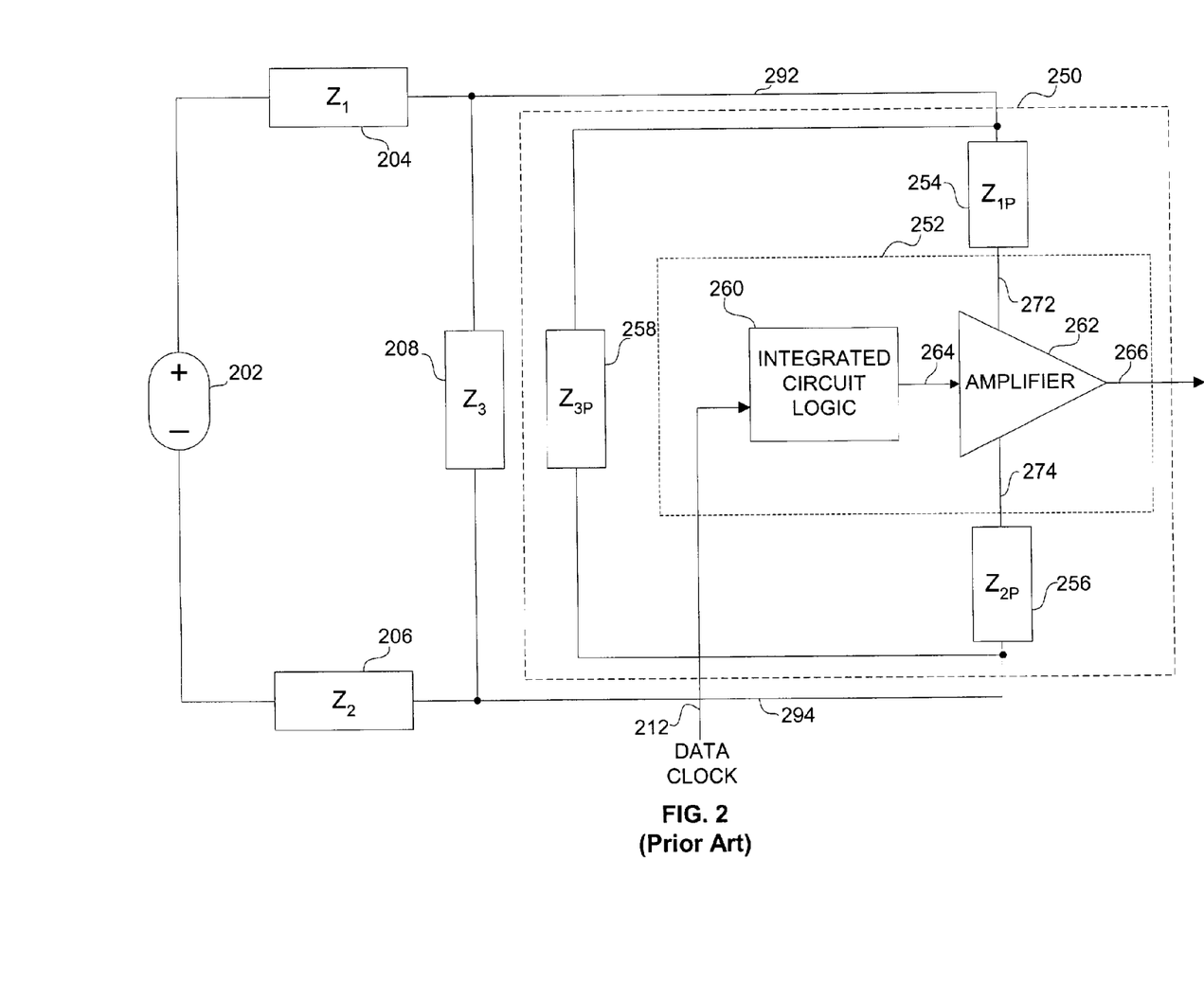
FIG. 2 shows a schematic of an integrated circuit and a power distribution network for the integrated circuit.

FIG. 2 shows a schematic of an IC (252), a chip package (250), and a power distribution network. The power supplied to the IC (252) must traverse from a power supply (202) across the power distribution network and the chip package (250) before it reaches the IC (252). The power distribution network includes the impedances $Z_1$ (204), $Z_2$ (206), and $Z_3$ (208). These impedances (204, 206, 208) may include resistive, capacitive, and inductive elements. The impedances (204, 206, 208) model both the inherent parasitics of the power distribution network and added components that may affect the voltage potentials supplied to the IC (252).

Two power supply lines (292, 294) supply power to the chip package (250) on which the IC is mounted. Inside the chip package (250), other components and parasitics, represented by impedances $Z_{1P}$ (254), $Z_{2P}$ (256), and $Z_{3P}$ (258), affect the voltage potentials supplied to the IC (252). Impedances $Z_{1P}$ (254), $Z_{2P}$ (256), and $Z_{3P}$ (258) may contain resistive, capacitive, and inductive elements.

For each power supply line (292, 294), there are two relevant voltage potentials: the voltage potential produced by the power supply (202), and the voltage potential actually applied to the IC (252) (on lines 272 and 294). The voltage potentials on these lines (272, 274) are affected by characteristics of the power distribution network and the chip package (250). Even under nominal operating conditions, some of the voltage potential produced by the power supply (202) is lost within the power distribution network due to resistive parasitics. For example, a power supply (202) producing 5.0 volts between $V_{DD}$ and ground might actually apply 4.8 volts and 0.2 volts to the IC (252). In the present invention, the voltage potentials produced by the power supply (202) will be referred to as $V_{DD,PS}$ and $V_{SS,PS}$, and the voltage potentials applied to the IC (252) will be referred to as $V_{DD,IC}$ and $V_{SS,IC}$. The voltage potentials applied to the IC determine the maximum and minimum voltage potentials available on the IC (252) and may affect the IC's operation.

In FIG. 2, the IC (252) comprises IC logic (260) and an amplifier (262). The amplifier (262) transmits signals to a receiver (not shown) outside the chip package (250). The IC (252) may operate with a data clock signal supplied on line (212). The data clock signal is used to synchronize data input to and output from the IC (252). Data output by the IC logic (260) is sent on line (264) to the amplifier (262) for transmission from the IC (252) on line (266). In one or more embodiments, the IC logic (260) and the amplifier (262) may use separate power supply lines.

The impedances (204, 206, 208) in the power distribution network and the impedances (254, 256, 258) in the chip package may form a "parasitic tank circuit" that may resonate if the frequency of switching elements within the IC (252) closely matches a resonant frequency of the power distribution network.

Data transmitted between integrated circuits is a significant contributor to switching-induced power supply resonance. Signals transmitted from the IC (252) are greatly amplified by the amplifier (262) before transmission, and may have a relatively large effect on the power distribution network. If a frequency of data transmitted between integrated circuits occurs at a resonant frequency of the power distribution network, the system may experience power supply resonance.

The power supply resonance is manifest as "ringing," an oscillation of the power supply voltage potentials at the resonance frequency. A moderate increase in power supply voltage potential may not affect the operation of the circuit, but a sag in the voltage potential of the power supply on lines (272) and (274) may affect the amplifier (262) by narrowing the output voltage potential swing.

Figure 3:
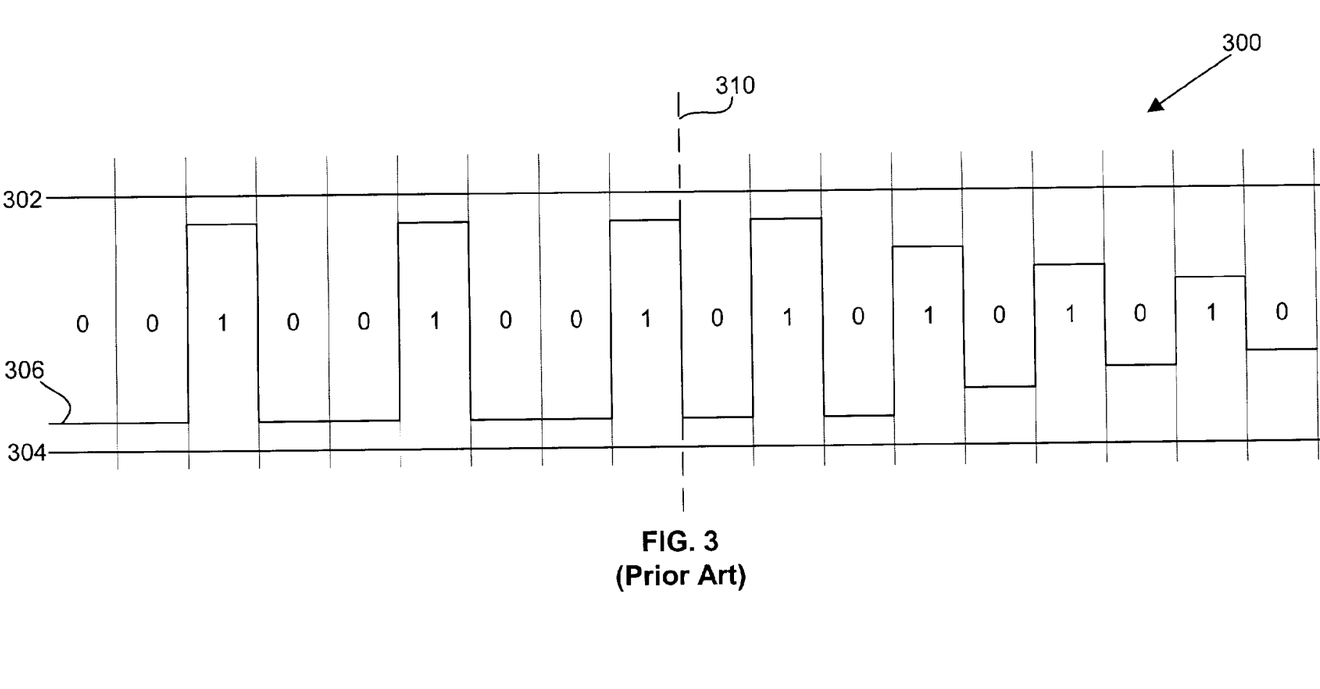
FIG. 3 shows a series of bits output by an integrated circuit.

FIG. 3 illustrates the effects of power supply resonance on data transmissions (306). Line (302) is $V_{DD,PS}$, and line (304) is $V_{SS,PS}$. Signal (306) represents the output of the amplifier (262 shown in FIG. 2). The signal (306) represents the transmission of 18 bits in two different bit patterns. Line (310) separates the two bit patterns.

The first pattern is a repeated set of bits in a pattern 001 in which a binary one is transmitted every third bit. With this bit pattern, each bit is relatively close to the appropriate power supply voltage potential (i.e., 1 near $V_{DD,PS}$, 0 near $V_{SS,PS}$). The second pattern is a repeated set of bits in a pattern 01 in which a binary one is transmitted every other bit. The second pattern has a different data transmission frequency than the first pattern. The second pattern has a data transmission frequency near a resonant frequency of the power distribution network. To the right of line (310), the power supply begins to resonate. The voltage potentials supplied to the IC (252 shown in FIG. 2) sag because the lines (272, 274 shown in FIG. 2) are not able to supply sufficient power. As the voltage potentials supplied to the IC (252 shown in FIG. 2) sag, so too do the voltage potentials (306) output by the amplifier (262 shown in FIG. 2).

Figure 4:
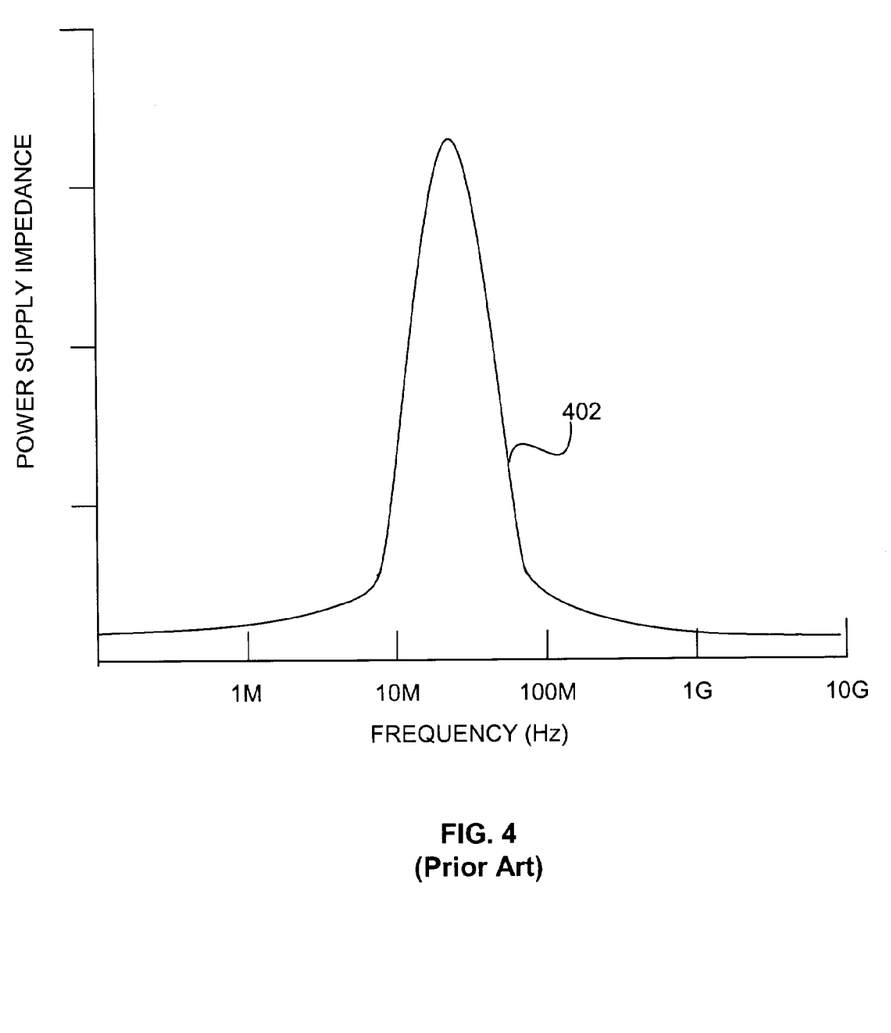
FIG. 4 shows a graph depicting power supply system impedance.

The sagging of the voltage potentials supplied to the IC (252 shown in FIG. 2) on lines (272, 274 shown in FIG. 2) is a result of an increase in power supply impedance at the power supply resonance frequency. A representative graph of power supply impedance is shown in FIG. 4. Over a particular range of frequencies for the switching logic on the IC (252 shown in FIG. 2), the power supply impedance increases because the circuit formed by the IC (252 shown in FIG. 2), chip package (250 shown in FIG. 2), and power distribution network resonates. A spike in a power supply impedance curve (402) has the effect of current-starving the IC (252 shown in FIG. 2) by decreasing the amount of current allowed to flow to the IC (252 shown in FIG. 2). When the IC (252 shown in FIG. 2) is current-starved, some voltage potentials on the IC (252 shown in FIG. 2) may shift from their desired values. Accordingly, an increase in the power supply impedance may cause undesired operation of the IC (252 shown in FIG. 2) as provided in the example shown in FIG. 3.

SUMMARY OF INVENTION

According to one aspect of the present invention, a method for quantifying power supply resonance effects in an integrated circuit comprises selecting a plurality of reference voltage potentials for an input buffer on a receiver; selecting a plurality of data transmission frequencies for at least one of the plurality of reference voltage potentials; transmitting at least one bit pattern to the input buffer for at least one combination of reference voltage potentials selected from the plurality of reference voltage potentials and data transmission frequencies selected from the plurality of data transmission frequencies; measuring a voltage potential on the receiver after transmitting for at least one combination of reference voltage potential and data transmission frequency; and quantifying power supply resonance effects on the integrated circuit based on the measuring.

According to one aspect of the present invention, a method for quantifying power supply resonance effects in an integrated circuit comprises selecting a plurality of reference voltage potentials for an input buffer on a receiver; selecting a plurality of data transmission frequencies for at least one of the plurality of reference voltage potentials; transmitting at least one data bit to the input buffer for at least one combination of reference voltage potentials selected from the plurality of reference voltage potentials and data transmission frequencies selected from the plurality of data transmission frequencies; latching the at least one data bit to produce at least one latched data bit; comparing the at least one data bit to the at least one latched data bit; and quantifying power supply resonance effects on the integrated circuit based on the comparing.

According to one aspect of the present invention, a computer system to quantify power supply resonance effects in an integrated circuit comprises a processor; a memory; and software instructions. The software instructions stored in the memory enable the computer system, under control of the processor, to perform selecting a plurality of reference voltage potentials for an input buffer on the integrated circuit; selecting a plurality of data transmission frequencies for at least one of the plurality of reference voltage potentials; transmitting at least one data bit to the input buffer for at least one combination of reference voltage potentials selected from the plurality of reference voltage potentials and data transmission frequencies selected from the plurality of data transmission frequencies; determining correct receipt of the at least one data bit on the integrated circuit after transmitting; and quantifying power supply resonance effects on the integrated circuit.

According to one aspect of the present invention, an apparatus for quantifying power supply resonance effects in an integrated circuit comprises means for selecting a plurality of reference voltage potentials for an input buffer on the integrated circuit; means for selecting a plurality of data transmission frequencies for each of the plurality of reference voltage potentials; means for transmitting at least one data bit to the input buffer for at least one combination of reference voltage potentials selected from the plurality of reference voltage potentials and data transmission frequencies selected from the plurality of data transmission frequencies; means for determining correct receipt of the at least one data bit on the integrated circuit after each transmitting; and means for quantifying power supply resonance effects on the integrated circuit.

Other aspects and advantages of the invention will be apparent from the following description and the appended claims.

DETAILED DESCRIPTION

Embodiments of the present invention relate to a method for characterizing effects that power supply resonance have on digital mode operation of an integrated circuit.

A data transmission frequency determines the frequency of switching in an output amplifier (262 shown in FIG. 2) of a transmitting IC (252 shown in FIG. 2). The data transmission frequency is determined by two parameters: the frequency of a data clock signal, which determines the frequency at which bits are transmitted, and the pattern of transmitted bits. Adjusting either of these parameters will change the data transmission frequency. The pattern of transmitted bits may cause the data transmission frequency to differ significantly from the frequency of the data clock signal.

Figure 5:
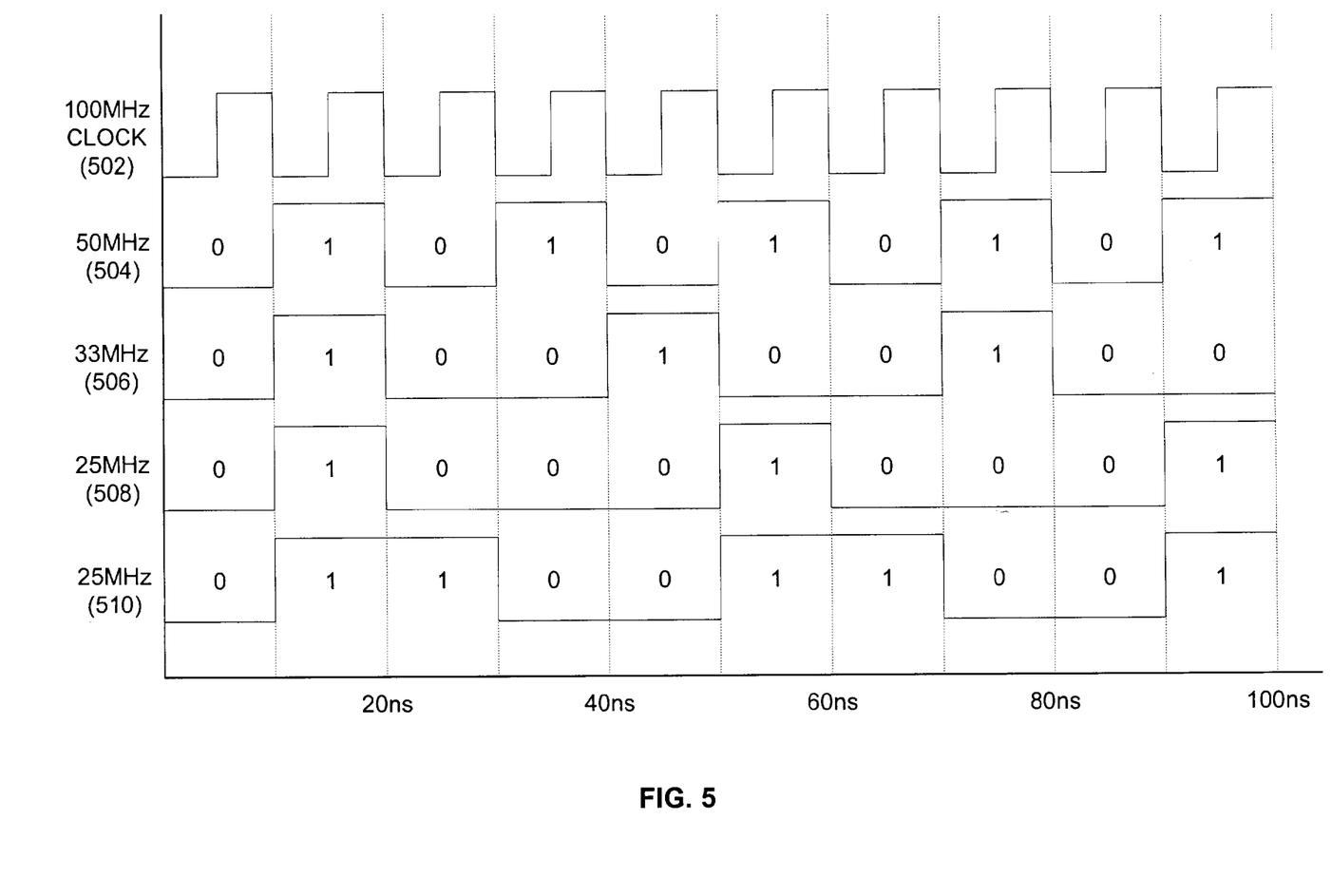
FIG. 5 shows a graph of bit patterns in accordance with an embodiment of the present invention.

FIG. 5 shows several exemplary bit patterns in accordance with an embodiment of the present invention. The bit patterns are based on a 100 MHz data clock frequency that may exhibit data transmission frequencies significantly different than 100 MHz. A data clock signal (502) is shown on the top line of the graph. Transmitted data is held steady during the rising data clock signal (502) edges.

The second signal (504) on the graph shows an alternating bit pattern "0101010101." A resulting data transmission frequency of 50 MHz occurs. The third signal (506) on the graph shows the bit pattern "0100100100." With this bit pattern, the data transmission frequency is 33 MHz. The fourth signal (508) on the graph shows a bit pattern with a binary one every fourth clock cycle, and a data transmission frequency of 25 MHz. The fifth signal (510) on the graph shows a different 25 MHz signal. The bit pattern is "0011," and its duty cycle is 50%. Bit patterns with a 50% duty cycle have the strongest effect in inciting resonance.

If a data transmission frequency generated by a particular bit pattern matches the resonant frequency of the power distribution network, the IC (252 shown in FIG. 2) may not transmit data at a proper voltage potential. Doubling the frequency of the data clock signal (502) would double the data transmission frequencies of the second signal (504), third signal (506), fourth signal (508), and fifth signal (510).

Figure 6:
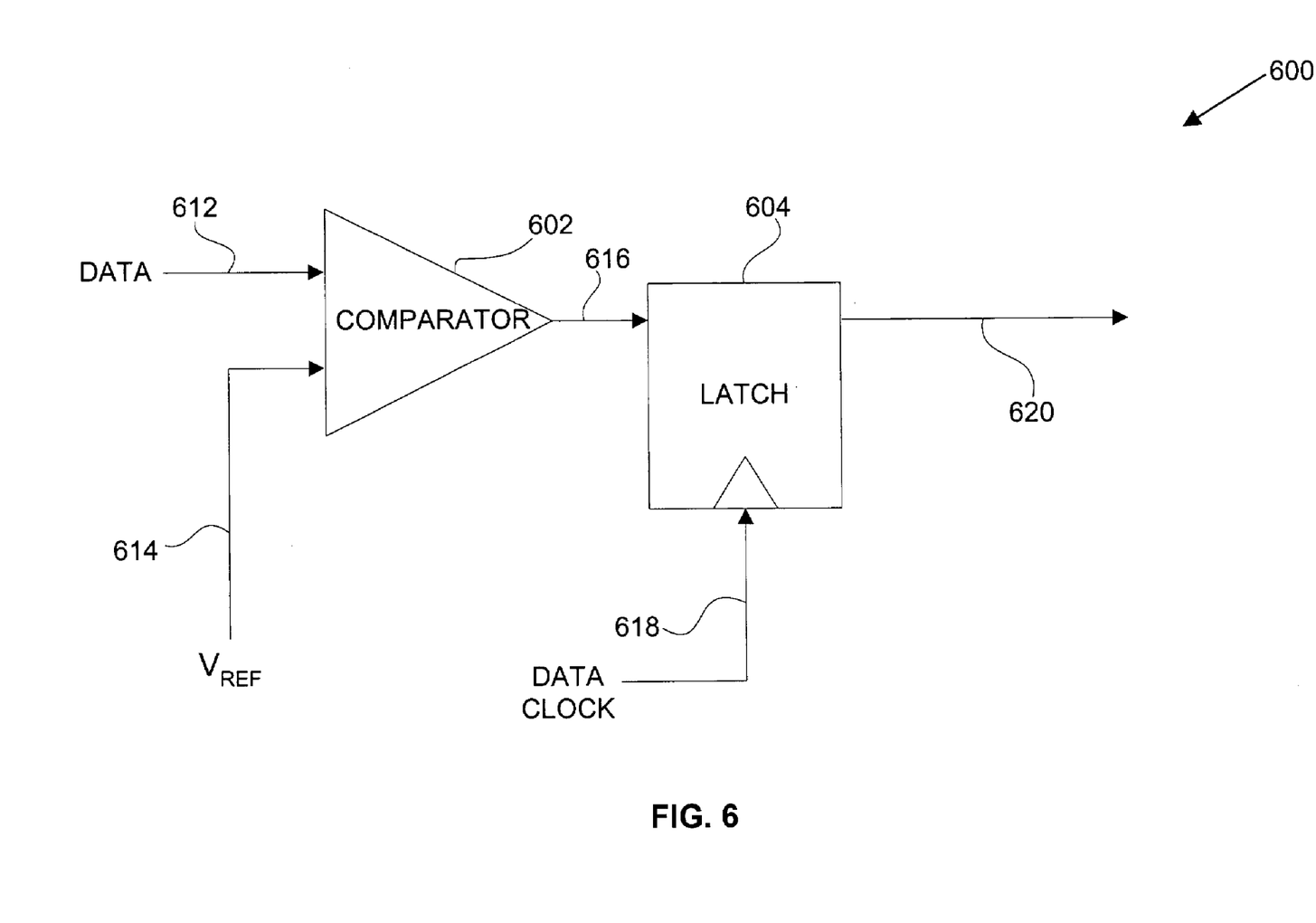
FIG. 6 shows a block diagram of an integrated circuit in accordance with an embodiment of the present invention.

FIG. 6 shows a block diagram of an exemplary receiver's input buffer (600) in accordance with an embodiment of the present invention. Input data bits are transmitted into the input buffer (600) on line (612). Each input data bit is transmitted using an analog voltage potential representing a binary one or a binary zero. Data bits on line (612) are sent from another IC's output amplifier, for example amplifier (262) shown in FIG. 2. A reference voltage potential is provided to the input buffer (600) on line (614). The reference voltage potential is used for comparison with a voltage potential of the data bits in order to determine whether the voltage potentials of the data bits represent binary "ones" or "zeros."

The first stage of the input buffer (600) is a comparator (602). In FIG. 6, the comparator's (602) input on line (612) is fed data bits from the IC (252 in FIG. 2) under test. The comparator's (602) input on line (614) is fed the reference voltage potential, $V_{REF}$ on line (614). If the data bit input on line (612) has a greater voltage potential than the reference voltage potential on line (614), the output (616) of the comparator (602) will be a binary "one." If the data bit input on line (612) has a lower voltage potential than the reference voltage potential on line (614), the output (616) of the comparator (602) will be a binary "zero."

The reference voltage potential $V_{REF}$ must be at some voltage potential between the voltage potentials $V_{DD,IC}$ and $V_{SS,IC}$ for the circuit to be able to interpret both "ones" and "zeros." The reference voltage potential may be set by adjusting parameters on the receiver, or it may be supplied by a voltage potential supplied off of the receiver. It is usually required that a data voltage potential be greater than or less than the reference voltage potential by some minimum voltage potential to guarantee that a bit be properly interpreted. In other words, a guard band exists between the reference voltage potential and the voltage potential of the data The guard band is the range over which an IC designer expects the reference voltage potential to fluctuate. The guard band allows for variation in the reference voltage potential caused by variations in temperature, layout, manufacturing process, and other offsets. In normal operation, the reference voltage potential may fluctuate within this band. A signal will be correctly interpreted as long as it is above or below the intended reference voltage potential plus or minus the guard band, respectively.

In the case that the data bit on line (612) transmitted by the IC (252 shown in FIG. 2) is at a voltage potential very close to $V_{DD,PS}$ for a binary "one" or is at a voltage potential very close to $V_{SS,PS}$ for a binary "zero," the comparator (602) will correctly determine whether a signal is a binary "one" or a binary "zero." Binary values may be misinterpreted if the voltage potentials representing binary "ones" and "zeros" are close to the reference voltage potential $V_{REF}$.

A latch (604) receives an output signal on line (616) provided by the comparator (602) and latches the output signal at each cycle of the data clock signal on line (618).

The latched data is transmitted on signal line (620) to the other circuits that can then use the latched data for its operations. The data clock signal may be generated external to the input buffer (600).

At data transmission frequencies near the resonance frequency, where the power supply voltage potentials on the transmitting IC (252 shown in FIG. 2) are affected, the correctness of interpretation of bits inside the receiver will depend on the selected reference voltage potential. For example, $V_{DD,PS}$ is five volts, $V_{SS,PS}$ is zero volts (ground), and the guard band occupies 0.5 volts above and below the reference voltage potential. A "good" binary "one" is represented by an analog voltage potential near $V_{DD,PS}$. For this example, a good binary "one" will be 4.8 volts. A "good" binary "zero" is represented by an analog voltage potential near $V_{SS,PS}$. For this example, a good binary zero will be 0.2 volts. For a 4.8 volt signal to register as a binary one, the reference voltage potential must be at least 0.5 volts less than 4.8 volts. For a 0.2 volt signal to register as a binary "zero," the reference voltage potential must be at least 0.5 volts greater than 0.2 volts. So we may define an "effective $V_{REF}$ range" as the range of reference voltage potential over which binary ones and zeros are both correctly interpreted. In this example, that range is 0.7 volts to 4.3 volts. The receiver will correctly interpret input bits with any selection of reference voltage potential from within the effective $V_{REF}$ range, as long as the transmitting IC (252 in FIG. 2) sends "good" binary "ones" and "zeros," represented by voltage potentials near $V_{DD,PS}$ and $V_{SS,PS}$, respectively.

When $V_{DD,IC}$ and $V_{SS,IC}$ (the voltage potentials on lines (272) and (274) shown in FIG. 2) shift from their normal values due to resonance, the output of the transmitting amplifier (262 shown in FIG. 2) may sag as shown in FIG. 3. This voltage potential sag may constrict the effective $V_{REF}$ range. Taking the previous example, if a power supply resonance causes $V_{DD,IC}$ to fall from 4.8 volts to 3.8 volts, a binary one will be attenuated to 3.8 volts, and the effective $V_{REF}$ range is now 0.7 volts to 3.3 volts.

In this example, if the selected reference voltage potential is 3.5 volts, then the IC will work normally while $V_{DD,IC}$ and $V_{SS,IC}$ are at their nominal values (4.8 volts and 0.2 volts, respectively). However, if a resonance in the power supply distribution network causes $V_{DD,IC}$ to fall from the correct value of 4.8 volts to 3.8 volts, then a 3.8 volt binary "one" will be in the guard band, only 0.3 volts greater than the reference voltage potential. If the signal voltage potential is in the guard band, the input buffer (600) may not properly register the signal as a binary "one." An error in a received bit may occur.

Under non-resonant conditions, nearly all of the voltage potential generated by the power supply is applied to the IC. $V_{DD,PS}$ is approximately equal to $V_{DD,IC}$, $V_{SS,PS}$ is approximately equal to $V_{SS,IC}$, and the effective $V_{REF}$ range is large. When the power distribution network resonates, less voltage potential is applied to the IC than is generated by the power supply; $V_{DD,PS}$ may no longer be equal to $V_{DD,IC}$; $V_{SS,PS}$ may no longer be equal to $V_{SS,IC}$; and the effective $V_{REF}$ range may be constricted. The resonant frequency may be found by determining the data transmission frequency at which the effective $V_{REF}$ range is the smallest.

The present invention is a method to find the data transmission frequencies at which the effective $V_{REF}$ range is constricted. Transmitted bit patterns that constrict the effective $V_{REF}$ range have a data transmission frequency near the resonant frequency of the power distribution network. A plurality of data transmission frequencies and a plurality of values of the reference voltage potential are selected, and the IC is tested at a plurality of combinations of these parameters. The test consists of transmitting a stream of data bits from a transmitting IC to a receiver, then determining whether the transmitted bits were correctly interpreted by the receiver.

In one embodiment, the receiver's input buffer (600) is used to latch the transmitted bits. The latched bits are then compared to the transmitted bits to see what fraction, if any, were received in error.

In one embodiment, a tester, e.g., a voltmeter, oscilloscope, or the like, is used to measure the voltage potential at some relevant node in the receiver (e.g., node 616). By measuring a voltage potential and comparing its analog value numerically to the value of reference voltage potential, a determination may be made as to whether power supply resonance has caused a change in the power supply voltage potential significant enough to cause an error.

Under conditions where power supply resonance affects data transmission, transmitted bits may be misinterpreted by the receiver. At data transmission frequencies near the resonance frequency, the input buffer (600) may become extremely sensitive to the reference voltage potential, and errors may occur. If the resonance creates enough impedance, the input buffer (600) may not be able to properly interpret an input bit at the resonance frequency regardless of the reference voltage potential.

The effects of the power supply resonance may be quantified by rating each combination of data transmission frequency and reference voltage potential as a "pass" or "fail" based on a bit error rate. The results of each test may be recorded. If the IC is operating properly, bits will be correctly interpreted, and the output bit stream will match the input bit stream. If power supply resonance causes the voltage potentials applied to the transmitting IC to deviate, the effective $V_{REF}$ range will constrict. Some of the values of the reference voltage potential that allow transmitted bits to be correctly interpreted under non-resonant conditions may now lead to malfunction (i.e., misinterpretation of transmitted bits). The output bits will not match the input bits.

Figure 7:
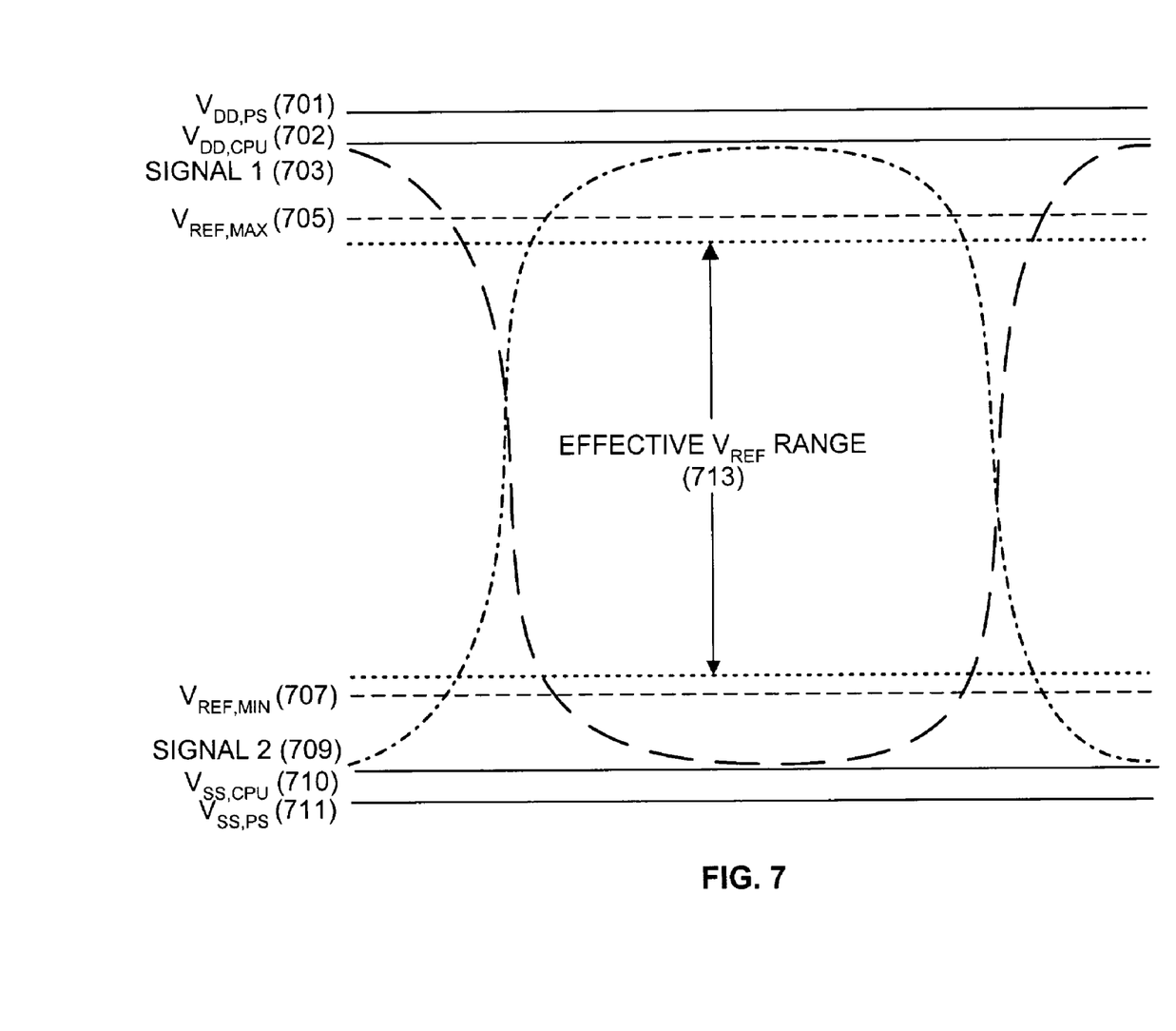
FIG. 7 shows a graph of waveforms in accordance with an embodiment of the present invention.

FIG. 7 illustrates several exemplary waveforms under normal operating conditions (i.e., the power distribution network does not resonate) in accordance with embodiments of the present invention. $V_{DD,PS}$ (701) and $V_{SS,PS}$ (711) are the two voltage potentials provided by the power supply. One of ordinary skill in the art will understand that even under non-resonance conditions, some of the power supply voltage potential produced by the power supply will be lost in the power distribution network (FIG. 2) due to resistive losses. $V_{DD,IC}$ (702) and $V_{SS,IC}$ (710) are the two voltage potentials actually applied to the IC. The voltage potentials applied to the IC are similar to the voltage potentials produced by the power supply under these conditions.

$V_{REF,MAX}$ (705) and $V_{REF,MIN}$ (707) represent the maximum and minimum values of the reference voltage potential selected for testing. SIGNAL 1 (703) and SIGNAL 2 (709) represent two exemplary data signals that may be observed at the output (266 shown in FIG. 2) of the amplifier (262 shown in FIG. 2) on the transmitting IC (252 shown in FIG. 2). Because the power distribution network is not resonating in this example, the power supply voltage potentials applied to the IC are similar to the voltage potentials produced by the power supply. Accordingly, SIGNAL 1 (703) and SIGNAL 2 (709) have maximum and minimum voltage potentials that are near $V_{DD,PS}$ (701) and $V_{SS,PS}$ (711), respectively. SIGNAL 1 (703) and SIGNAL 2 (709) may be correctly interpreted with a wide range of reference voltage potentials.

If the reference voltage potential is set at the extremes of the overall test range shown here, near $V_{REF,MAX}$ (705) or $V_{REF,MIN}$ (707), even SIGNAL 1 (703) and SIGNAL 2 (709) may fail to properly register as the appropriate binary value (note the discrepancy between $V_{REF,MAX}$ (705) and the top of the effective $V_{REF}$ range (713)); however, there is a large effective $V_{REF}$ range (713) over which the data signals will be correctly interpreted.

Figure 8:
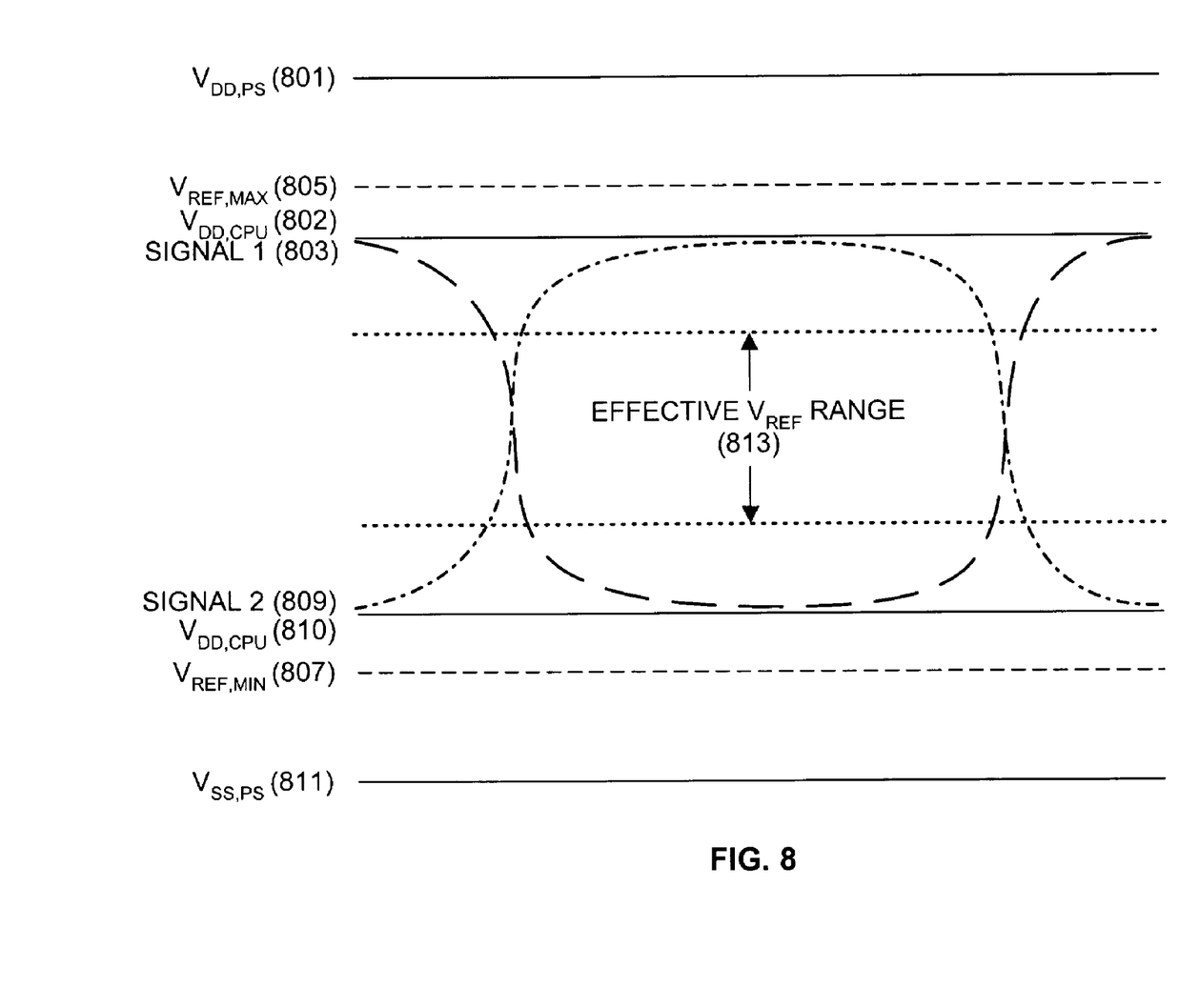
FIG. 8 shows a graph of waveforms in accordance with an embodiment of the present invention.

FIG. 8 shows a graph in accordance with an embodiment of the present invention. FIG. 8 is similar to FIG. 7, but under resonant conditions. The voltage potentials provided by the power supply are $V_{DD,PS}$ (801) and $V_{SS,PS}$ (811). A reference voltage potential is tested over the range between $V_{REF,MIN}$ (807) and $V_{REF,MAX}$ (805), the same range tested in FIG. 7. Because of the resonance, the power supply voltage potentials at the IC (252 shown in FIG. 2) are significantly lower than $V_{DD,PS}$ (801) and $V_{SS,PS}$ (811). The voltage potentials applied to the IC are $V_{DD,IC}$ (802) and $V_{SS,IC}$ (810). SIGNAL 1 (803) and SIGNAL 2 (809) are limited by $V_{DD,IC}$ and $V_{SS,IC}$ and do not cover the full range over which the reference voltage potential is tested. The effective $V_{REF}$ range (813) is now a smaller range between the two sagging signal voltage potentials SIGNAL 1 (803) and SIGNAL 2 (809). Those skilled in the art will understand that the resonance can be observed as a narrowing of the effective $V_{REF}$ range that occurs when the circuit operates near resonance.

Figure 9:
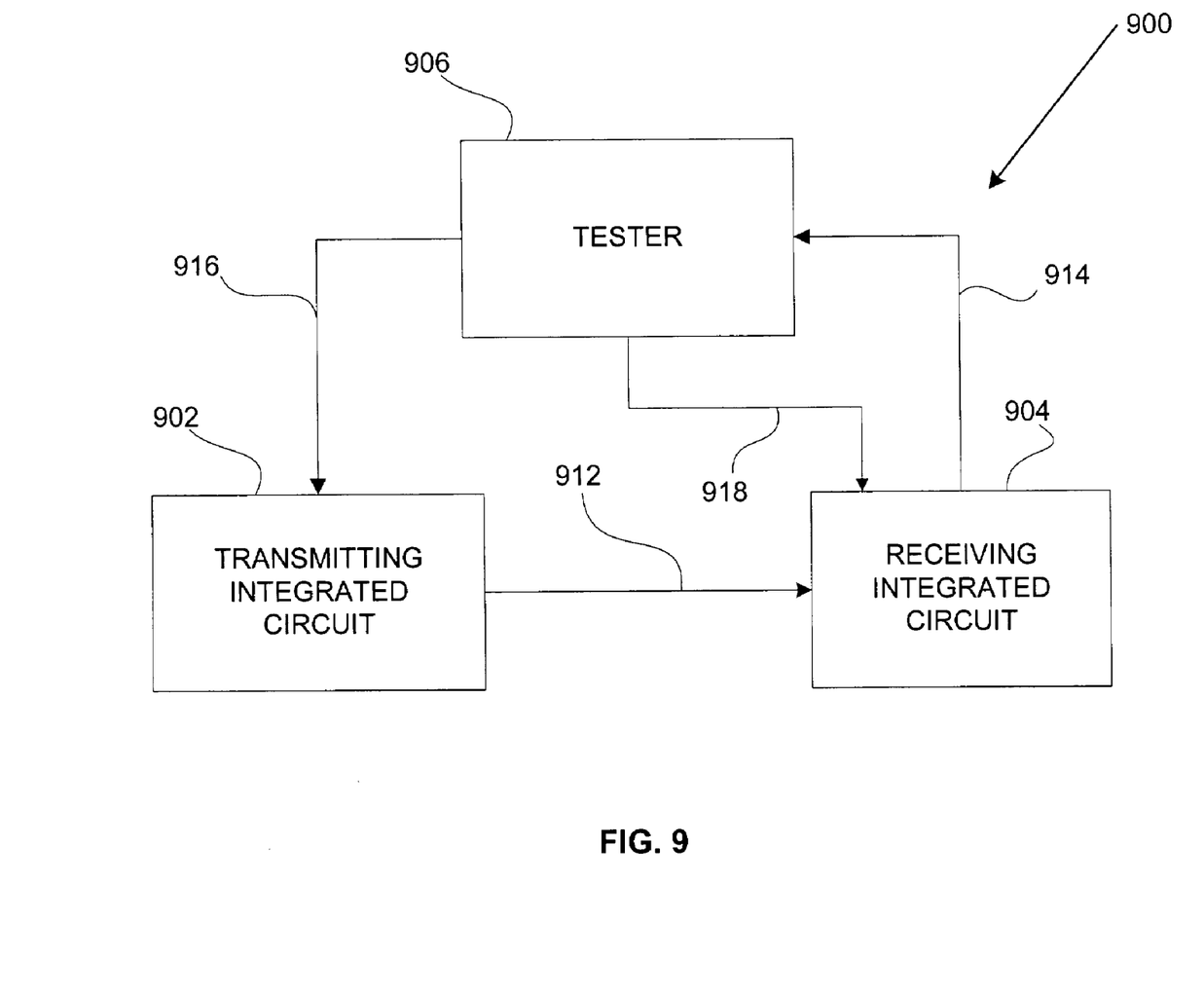
FIG. 9 shows a test interface system diagram in accordance with an embodiment of the present invention.

FIG. 9 illustrates an exemplary test architecture block diagram (900) in accordance with an embodiment of the present invention. A tester (906) is operatively connected to a transmitting IC (902) via control line (916). The tester (906) may use control line (916) to set a data clock frequency of the transmitting IC (902) and to select bits to be transmitted by the transmitting IC (902). The tester (906) is also connected to a receiving IC (904) via control line (918). The tester may use control line (918) to set a data clock frequency on the receiving IC (904) to match the data clock frequency of the transmitting IC (902), and to set a reference voltage potential for the receiving IC's (904) input buffer (600 shown in FIG. 6). The transmitting IC (902) transmits data bits on data line (912) to the receiving IC (904). The receiving IC (904) may make a comparison between a "known good" set of data bits, and the data bits transmitted during the test. The results of this comparison may be sent to the tester (906) on data line (914) for reporting. Alternatively, the receiving IC (904) may report its interpretation of the bits received from the transmitting IC (902), and the tester (906) may make a comparison between the interpreted bits and a previously stored copy of the transmitted data bits.

Figure 10:
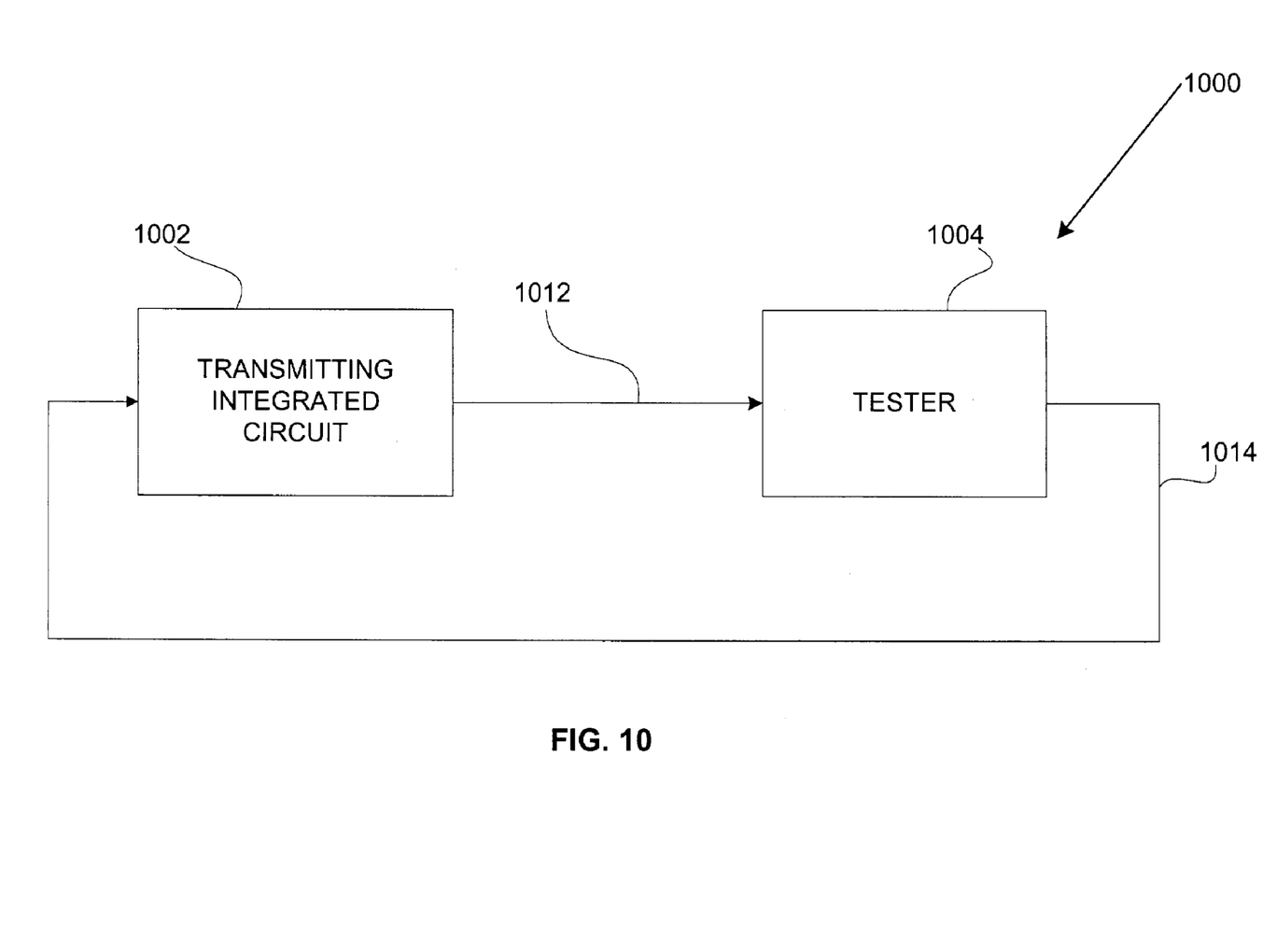
FIG. 10 shows a test interface system diagram in accordance with an embodiment of the present invention.

FIG. 10 illustrates an exemplary test architecture block diagram (1000) in accordance with an embodiment of the present invention. In this embodiment, a tester is arranged as a receiver. The tester (1004) uses line (1014) to set a data clock frequency of a transmitting IC (1002) and to select bits to be transmitted by the transmitting IC (1002). The transmitting IC (1002) transmits data bits on line (1012) to the tester (1004), which sets its own reference voltage potential. The tester (1004) compares the bits sent to the transmitting IC (1002) to those received from the transmitting IC (1002) and reports the results.

Figure 11:
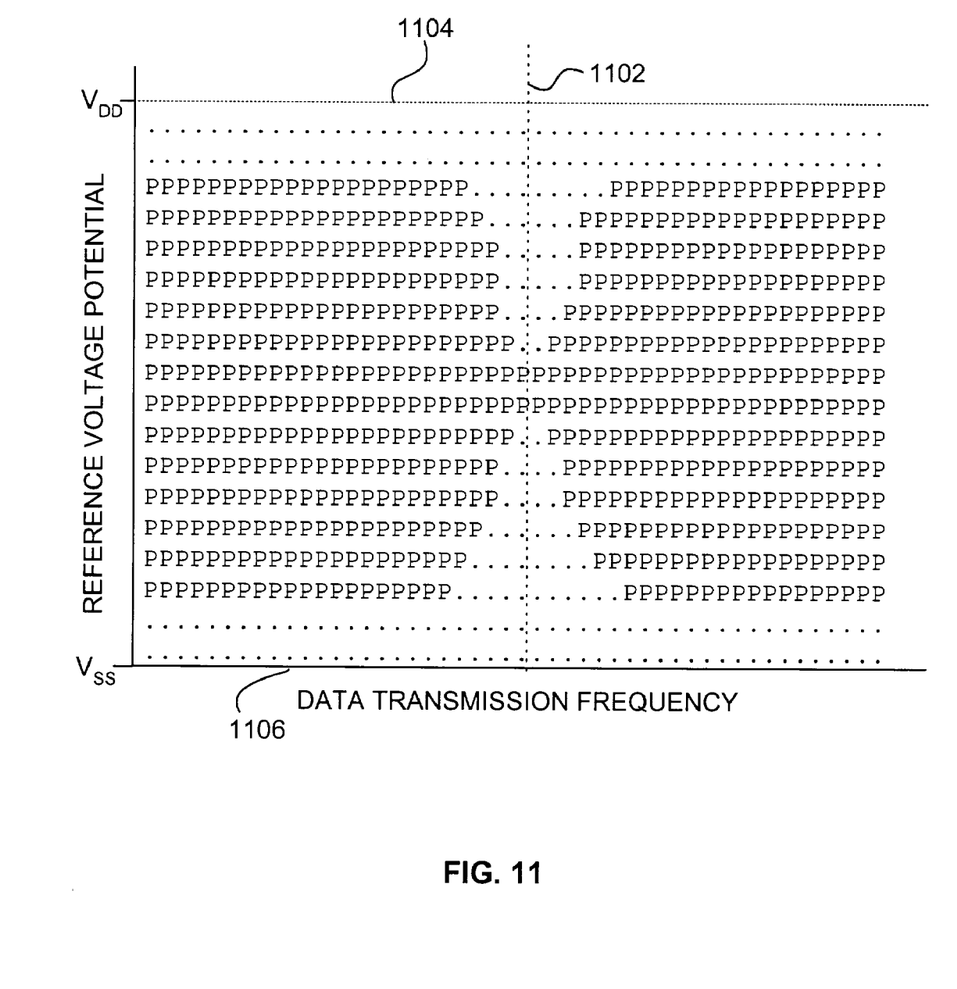
FIG. 11 shows a chart representing test data in accordance with an embodiment of the present invention.

FIG. 11 shows a chart representing output data in accordance with an embodiment of the present invention. An array of data points, each a combination of a data transmission frequency and a reference voltage potential, is shown. Each combination is rated as a pass or fail, based on a selected allowable error rate. The graph uses a "P" to represent a passing combination, and a "." to represent a failing combination. Because the reference voltage potential must be between $V_{DD}$ (1104) and $V_{SS}$ (1106) for an IC to work properly under any conditions, those are selected as the extremes of the reference voltage potential axis. One of ordinary skill in the art will understand that if the reference voltage potential is too close to either power supply voltage potential, the IC may not properly interpret data transmitted at any data transmission frequency. The resonant frequency (1102) is indicated by the pattern on the graph. Near this frequency, the effective range of the reference voltage potential is severely constricted.

Figure 12:
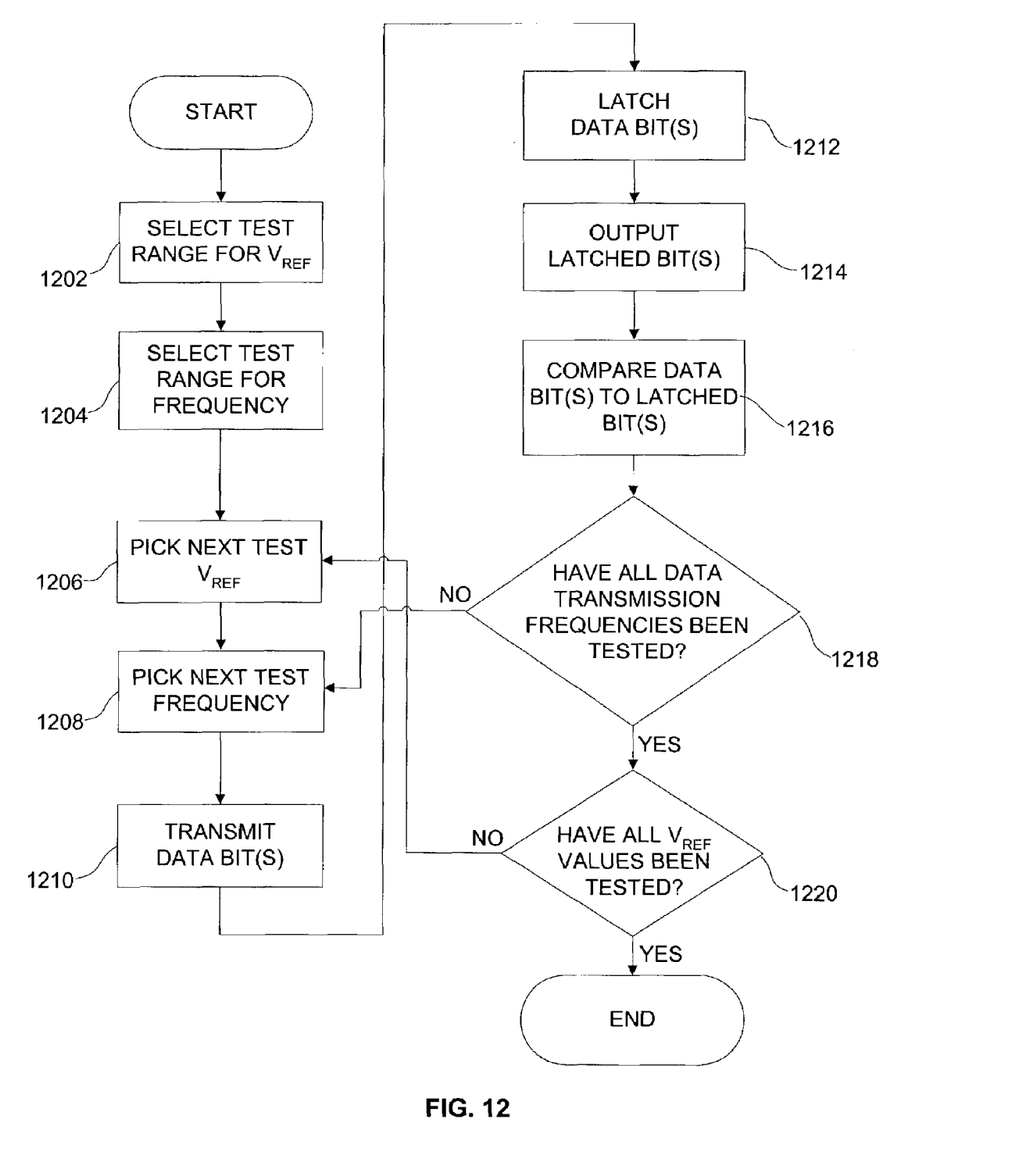
FIG. 12 shows a flow diagram in accordance with an embodiment of the present invention.

FIG. 12 shows a flow diagram in accordance with an embodiment of the present invention. The flow diagram in FIG. 12 describes exemplary steps used to test an IC for resonance. At step 1202, a test range of reference voltage potentials is selected. At step 1204, a test range of data transmission frequencies is selected. At step 1206, a test reference voltage potential is selected from the range chosen in step 1202 and applied to the receiver. At step 1208, a test data transmission frequency is selected from the range chosen in step 1204 and applied to the transmitting IC. At step 1210, data bits are transmitted to the receiver. At step 1212, the receiver latches the data bits, and at step 1214 the receiver outputs the latched bits. At step 1216, a comparison is made between the transmitted and latched bits, and the results are output for data collection.

At step 1218, a determination is made as to whether all data transmission frequencies within the selected test range have been tested. If not, the next data transmission frequency for test is selected and applied to the transmitting IC, and the transmission and comparison takes place again. Once all desired data transmission frequencies have been tested, step 1220 determines whether all values of reference voltage potential within the selected test range have been tested. If all the desired values of reference voltage potential have been tested, the test is complete. All desired data collection points (combinations of the data transmission frequency and the reference voltage potential) have been tested. If not, the next desired reference voltage potential is applied to the receiver, and the test repeats.

In FIG. 12, one of ordinary skill in the art will understand that using the receiver to latch the data bit is only one possible method of determining the resonance characteristics using the receiver. Instead of latching the bit on the receiver and comparing the latched bit to the transmitted bit, a voltmeter, oscilloscope, or the like may be used to measure the voltage potential at some relevant node in the receiver (e.g., node 616 shown in FIG. 6). One could measure such a voltage potential, compare its analog value numerically to the value of a reference potential, and determine whether the resonance has lowered the power supply voltage potential enough to cause errors.

Accordingly in FIG. 12, steps 1212 and 1214 may be replaced by measuring a voltage potential on the receiver. Step 1216 would become a numeric comparison between two analog voltage potentials, a data voltage potential and a reference voltage potential, instead of a digital comparison performed by digital hardware.

The present invention may be used as a testing protocol. As such, it may be implemented in software simulation tools. Simulation of analog and digital properties of electronic circuits is very common, and the present invention lends itself well to this type of simulation. The procedures are similar, but involve setting parameters of a computer model rather than setting actual physical quantities. Test values are selected for reference voltage potential and for the data transmission frequency. Combinations of these parameters are input to the simulation. For each combination of parameters, the simulator simulates the transmission of one or more bits, and determines whether the simulated IC (or some simplified model thereof) is affected by resonance.

Advantages of the present invention may include one or more of the following. In one or more embodiments, the present invention may be used to determine the effects power supply resonance has on digital operation of an IC.

In one or more embodiments, the present invention may be used to determine an IC's performance under a large range of conditions the IC may face in normal operation. The reference voltage potential test range may be selected to cover the range over which reference voltage potential may be expected to fluctuate in normal operation. Data transmission frequency test range may be selected to cover the set of frequencies employed in normal operation of the IC. If the IC passes at particular combinations of reference voltage potential and data transmission frequency, the IC manufacturer may be confident that power supply resonance will not negatively affect the IC's operation. Accordingly, design resources may be diverted to other areas.

In one or more embodiments, the present invention may be used to collect data on an IC and its power distribution network's resonance characteristics. The collected data may be used in future systems designed to control power supply resonance in such a system.

In one or more embodiments, it is possible that the resonance frequency may be near a desirable data transmission frequency. If the rest of a computer system (motherboard, clock generator, memory, I/O subsystems, etc.) is designed for a particular data transmission frequency, it would be expensive to redesign these elements for a different frequency. Advantageously, the present invention may be used to determine whether an IC will have problems at the desired frequency. If the IC will have problems at the desired frequency, then the IC's parasitics may be reconfigured in order to shift the resonant frequency away from the desired frequency of operation. The present invention assists in assessing the effects of reconfiguring the IC's parasitics on the resonant frequency.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for quantifying power supply resonance effects in an integrated circuit, comprising:
   selecting a plurality of reference voltage potentials for an input buffer on a receiver;
   selecting a plurality of data transmission frequencies for at least one of the plurality of reference voltage potentials;
   transmitting at least one bit pattern to the input buffer for at least one combination of reference voltage potentials selected from the plurality of reference voltage potentials and data transmission frequencies selected from the plurality of data transmission frequencies;
   measuring a voltage potential on the receiver after transmitting the at least one bit pattern; and
   quantifying power supply resonance effects on the integrated circuit based on the measuring.

2. The method of claim 1, further comprising recording the voltage potential measured after each transmitting.

3. The method of claim 1, wherein transmitting occurs for all possible combinations of reference voltage potentials selected from the plurality of reference voltage potentials and data transmission frequencies selected from the plurality of data transmission frequencies.

4. The method of claim 1, wherein the receiver is a tester.

5. The method of claim 1, wherein the receiver is another integrated circuit.

6. The method of claim 5, wherein the another integrated circuit reports received bits to a tester.

7. The method of claim 1, wherein a tester determines the selecting the reference voltage potential and the selecting the data transmission frequency.

8. The method of claim 1, further comprising creating a chart representing power supply resonance effects on the integrated circuit.

9. The method of claim 8, wherein the chart represents an error rate for at least one combination of reference voltage potential and data transmission frequency.

10. The method of claim 1, wherein the data transmission frequency is adjusted by changing at least one selected from the group consisting of the bit pattern transmitted to the receiver and a frequency of a data clock signal.

11. A method for quantifying power supply resonance effects in an integrated circuit, comprising:
    selecting a plurality of reference voltage potentials for an input buffer on a receiver;
    selecting a plurality of data transmission frequencies for at least one of the plurality of reference voltage potentials;
    transmitting at least one bit pattern to the input buffer for at least one combination of reference voltage potentials selected from the plurality of reference voltage potentials and data transmission frequencies selected from the plurality of data transmission frequencies;
    latching the at least one bit pattern to produce at least one latched bit pattern;
    comparing the at least one bit pattern to the at least one latched bit pattern; and
    quantifying power supply resonance effects on the integrated circuit based on the comparing.

12. The method of claim 11, wherein the latching is performed by the input buffer.

13. The method of claim 11, further comprising recording at least one item from the group consisting of a result of the comparing and the at least one latched bit pattern.

14. The method of claim 11, wherein the receiver is a tester.

15. The method of claim 11, wherein transmitting occurs for all possible combinations of reference voltage potentials selected from the plurality of reference voltage potentials and data transmission frequencies selected from the plurality of data transmission frequencies.

16. The method of claim 11, wherein the comparing is performed by one of the group consisting of a tester and the receiver.

17. The method of claim 11, wherein a tester determines the selecting the reference voltage potential and the selecting the data transmission frequency.

18. The method of claim 11, further comprising creating a chart representing power supply resonance effects on the integrated circuit.

19. The method of claim 18, wherein the chart represents an error rate for at least one combination of reference voltage potential and data transmission frequency.

20. The method of claim 11, wherein the data transmission frequency is adjusted by changing at least one selected from the group consisting of the bit pattern transmitted to the receiver and a frequency of a data clock signal.

21. A computer system to quantify power supply resonance effects in an integrated circuit, comprising:
    a processor;
    a memory; and
    software instructions stored in the memory for enabling the computer system under control of the processor, to perform:
        selecting a plurality of reference voltage potentials for an input buffer on a receiver;
        selecting a plurality of data transmission frequencies for at least one of the plurality of reference voltage potentials;
        transmitting at least one bit pattern to the input buffer for at least one combination of reference voltage potentials selected from the plurality of reference voltage potentials and data transmission frequencies selected from the plurality of data transmission frequencies;
        determining whether the at least one bit pattern received by the input buffer is the same as the at least one bit pattern transmitted by the integrated circuit; and
        quantifying power supply resonance effects on the integrated circuit based on the determining.

22. The computer system of claim 21, wherein an output device is used to display representations of results of the determining.

23. The computer system of claim 21, further comprising software instructions to perform:
    recording the results of the determining.

24. The computer system of claim 21, wherein the data transmission frequency is adjusted by changing at least one selected from the group consisting of the bit pattern transmitted to the receiver and a frequency of a data clock signal.

25. An apparatus for quantifying power supply resonance effects in an integrated circuit, comprising:
    means for selecting a plurality of reference voltage potentials for an input buffer on the integrated circuit;
    means for selecting a plurality of data transmission frequencies for at least one of the plurality of reference voltage potentials;
    means for transmitting at least one bit pattern to the input buffer for at least one combination of reference voltage potential selected from the plurality of reference voltage potentials and data transmission frequency selected from the plurality of data transmission frequencies;
    means for determining whether the at least one bit pattern received by the input buffer is the same as the at least one bit pattern transmitted by the integrated circuit; and
    means for quantifying power supply resonance effects on the integrated circuit based on the determining.

* * * * *